US007715245B2

(12) United States Patent
Kim et al.

(10) Patent No.: US 7,715,245 B2
(45) Date of Patent: *May 11, 2010

(54) PIPE LATCH DEVICE OF SEMICONDUCTOR MEMORY DEVICE

(75) Inventors: Kyoung-Nam Kim, Kyoungki-do (KR); Ho-Youb Cho, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/398,583

(22) Filed: Mar. 5, 2009

(65) Prior Publication Data
US 2009/0168485 A1 Jul. 2, 2009

Related U.S. Application Data

(63) Continuation of application No. 11/477,384, filed on Jun. 30, 2006, now Pat. No. 7,515,482.

(30) Foreign Application Priority Data

Sep. 29, 2005 (KR) ...................... 10-2005-0090922
Dec. 23, 2005 (KR) ...................... 10-2005-0128589

(51) Int. Cl.
*G11C 7/00* (2006.01)
(52) U.S. Cl. ............................ 365/189.05; 365/189.12; 365/191; 365/194; 365/233.1
(58) Field of Classification Search ............ 365/189.05, 365/189.12, 191, 194, 233.1; 711/169
See application file for complete search history.

(56) References Cited

U.S. PATENT DOCUMENTS 6,088,291 A 7/2000 Fujioka et al.

| 6,094,380 A | 7/2000 | Kim |
| 6,101,609 A | 8/2000 | Kawasaka |

(Continued)

FOREIGN PATENT DOCUMENTS

JP 11-66847 3/1999

(Continued)

OTHER PUBLICATIONS

Taiwanese Notice of Allowance, with English translation, issued in Taiwanese Patent Application No. TW 095123713, mailed Jul. 30, 2008.

*Primary Examiner*—Hoai V Ho
(74) *Attorney, Agent, or Firm*—IP & T Law Firm PLC

(57) ABSTRACT

A pipe latch device includes an output controller for outputting first and second output control signal groups based on a DLL clock signal and a driving signal; an input controller for generating an input control signal group; and a pipe latch unit for latching data on a data line when a corresponding input control signal is activated, and outputting latched data when a corresponding output control signal is activated, wherein the output controller includes a plurality of shifters, each for delaying an input data signal by half clock and one clock to output a first and second output signals in synchronization with the DLL clock signal and the driving signal; and a plurality of output control signal drivers for outputting the first and second output control signal groups based on the first and second output signals.

22 Claims, 8 Drawing Sheets

U.S. PATENT DOCUMENTS

| | | |
|---|---|---|
| 6,140,854 A | 10/2000 | Coddington et al. |
| 6,288,947 B1 | 9/2001 | Kim et al. |
| 6,353,574 B1 | 3/2002 | Shim |
| 6,539,454 B2 | 3/2003 | Mes |
| 6,724,684 B2 | 4/2004 | Kim |
| 6,813,195 B2 | 11/2004 | Bang et al. |
| 6,834,015 B2 | 12/2004 | Yoon |
| 7,515,482 B2 * | 4/2009 | Kim et al. ............ 365/189.05 |

FOREIGN PATENT DOCUMENTS

| | | |
|---|---|---|
| JP | 2000-124796 | 4/2000 |
| JP | 2001-35154 A | 2/2001 |
| JP | 2001-35155 A | 2/2001 |
| JP | 2004-171738 A | 6/2004 |
| JP | 10-0442967 B1 | 7/2004 |
| JP | 2005-235364 A | 9/2005 |
| KR | 1998-50153 | 9/1998 |
| KR | 10-2005-0041613 | 5/2005 |
| TW | 452796 | 9/2001 |
| TW | 200506965 | 2/2005 |

\* cited by examiner

PIPE LATCH DEVICE OF SEMICONDUCTOR MEMORY DEVICE

RELATED APPLICATION

This application is a Continuation of U.S. application Ser. No. 11/477,384, filed on Jun. 30, 2006 and issued as U.S. Pat. No. 7,515,482 on Apr. 7, 2009, claiming priority of Korean Application Nos. 10-2005-0090922, filed on Sep. 29, 2005 and 10-2005-0128589, filed on Dec. 23, 2005, the entire contents of each of which are hereby incorporated by reference.

FIELD OF THE INVENTION

The present invention relates to a semiconductor memory device; and, more particularly, to a pipe latch device of a semiconductor memory device for reducing unnecessary current consumption and a size thereof.

DESCRIPTION OF RELATED ART

Generally, a double data rate II synchronous dynamic random access memory (Hereinafter, referred to a DDR II SDRAM) is able to receive consecutive external input commands but does not process the input commands immediately. For example, in case of a read operation, a read column address strobe signal (Hereinafter, referred to a read CAS signal) is activated for performing the read operation so that it is possible to guarantee an internal time for processing the consecutive input command by delaying an activation timing of the read CAS signal.

A delay between an inputting moment of a read command and an activating moment of the read CAS signal is referred as an additive latency AL. A delay between the activating moment of the read CAS signal and an outputting moment of valid data is referred as a CAS latency CL. A delay between the activating moment of the read command and the outputting moment of the valid data is referred as a read latency.

As described above, the DDR II SDRAM latches data stored in a cell array block to a pipe latch in response to the read command and, then, outputs the data latched in the pipe latch after the CAS latency CL. Therefore, the data can be output without a data collision when the commands are input consecutively.

When data having a plurality of bits are output at a time by a single read command, the number of the bits in the output data is determined by setting a burst length of a mode register set MRS. Further, a sequence of the output data is also determined by setting the burst length of the mode register set MRS and is classified into an interleave mode or a sequential mode to thereby have a different data output order respectively.

SUMMARY OF THE INVENTION

It is, therefore, an object of the claimed invention to provide a semiconductor memory device for reducing an unnecessary current consumption and a size thereof.

In accordance with an aspect of the present invention, there is provided a semiconductor memory device, including an output controller for outputting first and second output control signal groups based on a delay locked loop (DLL) clock signal and a driving signal; an input controller for generating an input control signal group sequentially activated based on a column-related clock signal; and a pipe latch unit including a plurality of unit pipe latches, each for latching data on a data line when a corresponding input control signal of the input control signal group is activated, and outputting the latched data when a corresponding output control signal of the first and second output control signal groups is activated, wherein the output controller includes: a plurality of shifters, each for delaying an input data signal by half clock and one clock to output first and second output signals in synchronization with the DLL clock signal when the driving signal is activated; and a plurality of output control signal drivers for outputting the first and second output control signal groups based on the first and second output signals.

In accordance with another aspect of the present invention, there is provided a semiconductor memory device, including an output controller for outputting rising and falling output control signal groups based on a falling delay locked loop (DLL) clock signal and a driving signal; an input controller for generating an input control signal group sequentially activated based on a column-related clock signal; and a pipe latch unit including a plurality of unit pipe latches, each for latching data on a data line when a corresponding input control signal of the input control signal group is activated, and outputting the latched data when a corresponding output control signal of the rising and falling output control signal groups is activated, wherein the output controller includes: a plurality of shifters, each for delaying an input data signal by a half clock to output a second output signal and by one clock to output a first output signal in synchronization with the falling DLL clock signal when the driving signal is activated; a feedback unit for receiving the first output signal of one of the plurality of shifters and providing its output signal to a first shifter among the plurality of shifters; a plurality of rising output control signal drivers for outputting the rising output control signal group based on the second output signal; and a plurality of falling output control signal drivers for outputting the falling output control signal group based on the first output signal.

In accordance with a further aspect of the present invention, there is provided a semiconductor memory device, including an output controller for outputting rising and falling output control signal groups based on a rising delay locked loop (DLL) clock signal and a driving signal; an input controller for generating an input control signal group sequentially activated based on a column-related clock signal; and a pipe latch unit including a plurality of unit pipe latches, each for latching data on a data line when a corresponding input control signal of the input control signal group is activated, and outputting the latched data when a corresponding output control signal of the rising and falling output control signal groups is activated, wherein the output controller includes: a plurality of shifters, each for delaying an input data signal by a half clock to output a second output signal and by one clock to output a first output signal in synchronization with the rising DLL clock signal when the driving signal is activated; a feedback unit for receiving the first output signal of one of the plurality of shifters and providing its output signal to a first shifter among the plurality of shifters; a plurality of rising output control signal drivers for outputting the rising output control signal group based on the first output signal; and a plurality of falling output control signal drivers for outputting the falling output control signal group based on the second output signal.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Hereinafter, a pipe latch device of a semiconductor memory device in accordance with the present invention will be described in detail referring to the accompanying drawings.

Figure 1:
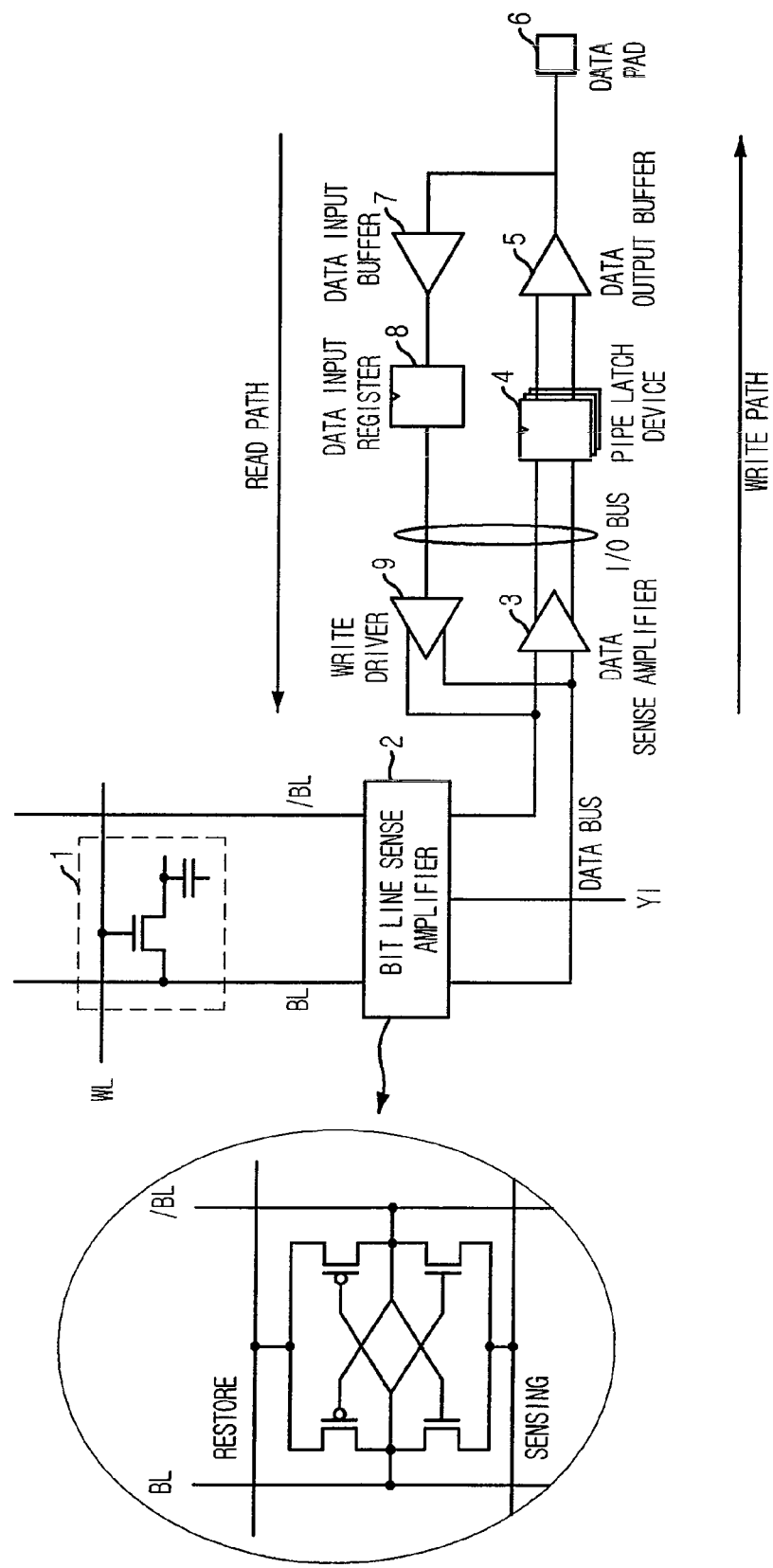
FIG. 1 is a block diagram demonstrating a data path of a semiconductor memory device in accordance with the claimed invention.

FIG. 1 is a block diagram demonstrating a data path of a semiconductor memory device in accordance with the claimed invention. The data path is formed between a memory cell array block and a data pad.

It is assumed that a DDR II SDRAM performs a 4-bit prefetch which transfers 4-bit memory cell data to a global data line GIO via a single data pin during a read operation.

As shown, first, in case of a read operation, a data stored in a unit cell 1 provided in the memory cell array block is loaded to a bit line pair BL and /BL. The data loaded at the bit line pair BL and /BL is sensed and amplified by the bit line sense amplifier 2 and, then, the data amplified by the bit line sense amplifier 2 is loaded to a data bus based on a column selection signal YI activated when a column address is applied. The data loaded at the data bus is amplified once more by a data sense amplifier 3. The amplified data is stored in a pipe latch device 4 via an I/O bus and output to a data output buffer 5 after the CAS delay CL. The data buffered in the data output buffer 5 is output through a data pad 6. The abovementioned data flow from the data sense amplifier 3 to the data output buffer 5 is referred to as a read path.

In case of a write operation, external data is input to a data input buffer 7 through the data pad 6. The data in the data input buffer 7 is stored in a data input register 8 and, then, transmitted to a write driver 9 through the I/O bus. The write driver 9 amplifies and transfers the data via the data bus to the bit line pair BL and /BL in the bit line sense amplifier 2 selected by the column selection signal YI activated by the column address. The data in the bit line pair BL and /BL is stored in the corresponding unit cell 1. The abovementioned data flow from the data input buffer 7 to the write driver 9 is referred to a write path.

Hereinafter, in the read path, the pipe latch device 4 and controllers for controlling the pipe latch device 4 will be described in detail.

Figure 2:
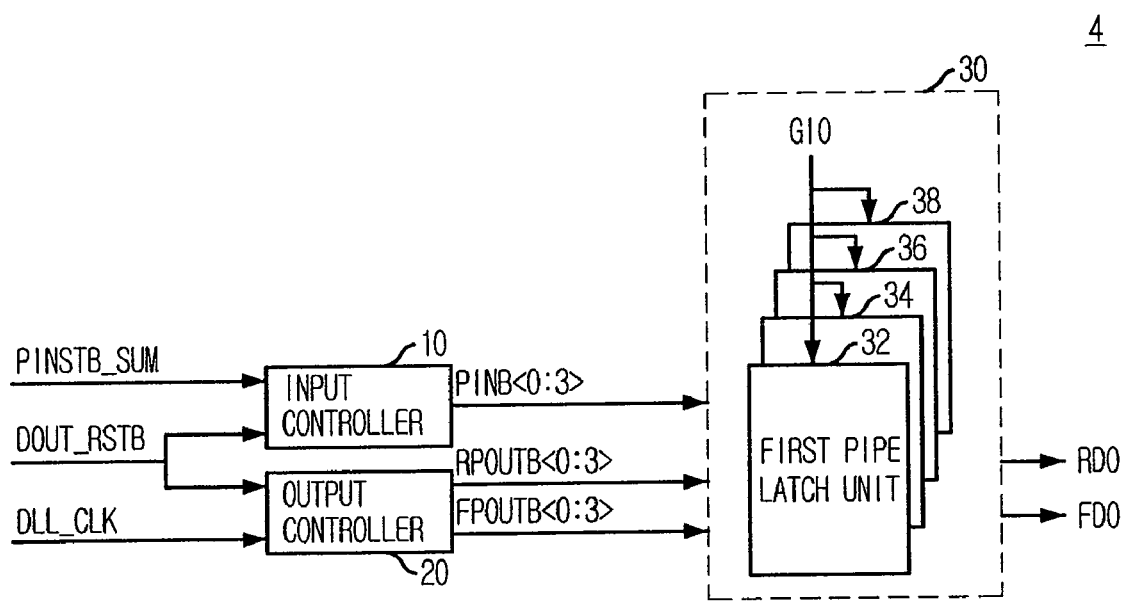
FIG. 2 is a block diagram describing a pipe latch block shown in FIG. 1.

FIG. 2 is a block diagram describing the pipe latch device 4 shown in FIG. 1.

As shown, the pipe latch device 4 of the semiconductor memory device includes an input controller 10, an output controller 20 and a pipe latch block 30.

The input controller 10 receives a column-related clock signal PINSTB_SUM and an initialization signal DOUT_RSTB and controls input timing when data transferred via a global data line GIO is input to the pipe latch block 30. The output controller 20 receives a delay locked loop (DLL) clock CLL_CLK and the initialization signal DOUT_RSTB and controls output timing when data stored in the pipe latch block 30 is output. The pipe latch block 30 includes a plurality of pipe latch units 32, 34, 36 and 38, each for latching the data on global data line GIO, and outputting the latched data.

Hereinafter, operation of the pipe latch device 4 is described.

When a read command is loaded, the column-related clock signal PINSTB_SUM is activated. The input controller 10 sequentially activates input control signal group PINB<0:3>. Accordingly, each of the first to fourth pipe latch units 32 to 38 stores the data on the global data line GIO based on a corresponding input control signal among the input control signal group PINB<0:3>.

The output controller 20 receives the DLL clock signal DLL_CLK and sequentially activates rising and falling output control signal groups RPOUTB<0:3> and FPOUTB<0:3>. Accordingly, each of the first to fourth pipe latch units 32 to 38 outputs a rising output data RDO and a falling output data FDO based on a corresponding output control signal among the rising and falling output control signal groups RPOUTB<0:3> and FPOUTB<0:3>.

If there is no command for accessing the memory cell array block, the initialization signal DOUT_RSTB is activated. The input controller 10 and the output controller 20 are initiated and thus the pipe latch block 30 is also initiated.

For reference, a delay locked loop (DLL) generates the DLL clock signal DLL_CLK by delaying an external clock loaded to the memory device by (tCK-tAC) so that data is output in synchronization with rising and falling edges of the external clock to thereby reduce the tAC. Herein, the 'tCK' is a unit clock and 'tAC' is a time difference between a read latency and an actual timing of outputting data. In detail, the DLL generates a rising DLL clock signal RCLKDLL and a falling DLL clock signal FCLKDLL for outputting data in synchronization with the rising and falling edges of the external clock. Herein, the rising DLL clock signal RCLKDLL and the falling DLL clock signal FCLKDLL have the same phase with that of the external clock. As a result, the data is output in synchronization with rising edges of the rising DLL clock signal RCLKDLL and the falling DLL clock signal FCLKDLL.

Figure 3:
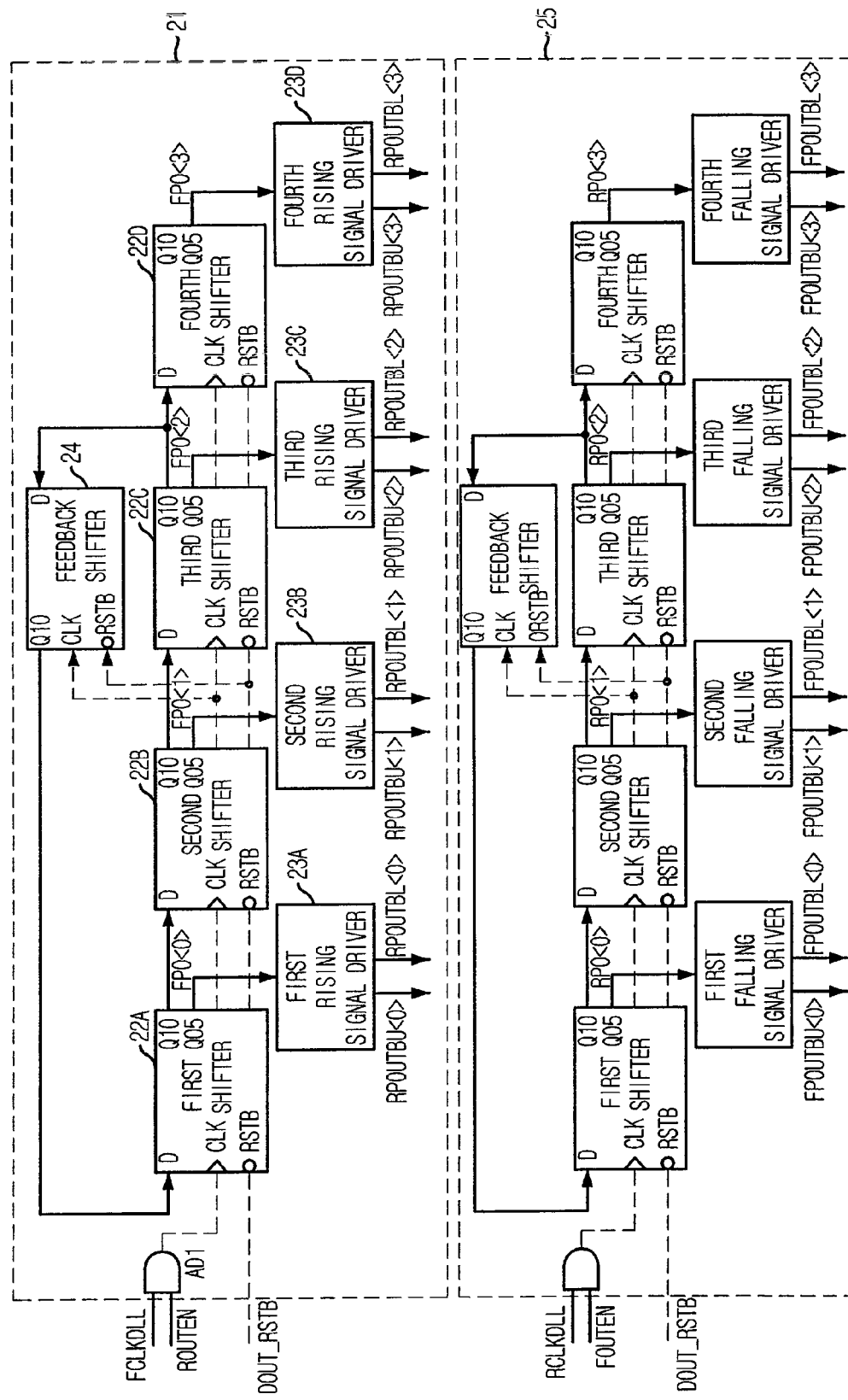
FIG. 3 is a schematic circuit diagram depicting an output controller in accordance with a first embodiment of the claimed invention.

FIG. 3 is a schematic circuit diagram depicting the output controller 20 in accordance with a first embodiment of the claimed invention.

As shown, the output controller 20 in accordance with the first embodiment of the claimed invention includes a rising output controller 21 and a falling output controller 25. The rising output controller 21 sequentially activates lower and upper rising output control signal groups RPOUTBL<0:3> and RPOUTBU<0:3> in response to a rising driving signal ROUTEN and the failing DLL clock signal FCLKDLL. The falling output controller 25 sequentially activates lower and upper falling output control signal groups FPOUTBL<0:3> and FPOUTBU<0:3> in response to a falling driving signal FOUTEN and the rising DLL clock signal RCLKDLL.

In detail, the rising output controller 21 includes an AND gate AD1, first to fourth shifters 22A, 22B, 22C and 22D, first to fourth rising output control signal drivers 23A, 23B, 23C and 23D, and a feedback shifter 24.

The AND gate AD1 performs an AND operation of the falling DLL clock signal FCLKDLL and the rising driving signal ROUTEN.

The first to fourth shifters 22A to 22D connected in series are initiated by receiving the initialization signal DOUT_RSTB as an inverted reset signal RSTB and receive a first output signal Q10 of a previous shifter as a data signal D to output first and second output signals Q10 and Q05 in synchronization with an output signal of the AND gate AD1 as a clock signal CLK. In FIG. 3, the second output signal Q05 of each shifter, represented as one of an intermediate falling output control signal group FPO<0:3>, is input to a corresponding one of the first to fourth rising output control signal drivers 23A to 23D.

The first to fourth rising output control signal drivers 23A to 23D drive the second output signal Q05 of the first to fourth shifters 22A to 22D to output the lower and upper rising output control signal groups RPOUTBU<0:3> and RPOUTBL<0:3>. The feedback shifter 24 is initiated by receiving the initialization signal DOUT_RSTB as an inverted reset signal RSTB and receives the first output signal Q10 of the third shifter 22C as a data signal D to output a first output signal Q10 to the data signal D of the first shifter 22A in synchronization with the output signal of the AND gate AD1 as a clock signal CLK.

The falling output controller 25 has the same structure as that of the rising output controller 21 except for receiving the falling driving signal FOUTEN and the rising DLL clock RCLKDLL and outputting an intermediate rising output control signal group RPO<0:3>, and lower and upper falling output control signal groups FPOUTBL<0:3> and FPOUTBU<0:3>.

Figure 4:
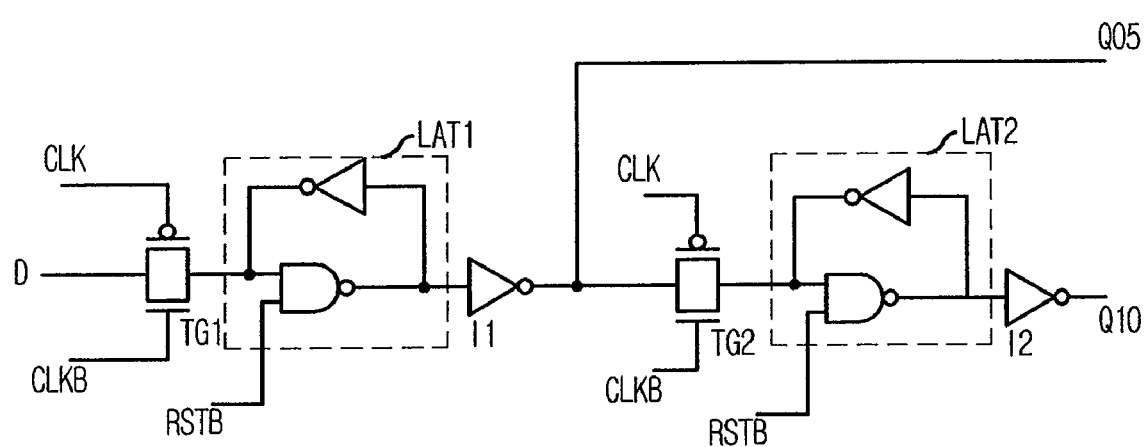
FIG. 4 is a detailed circuit diagram showing a first shifter shown in FIG. 3.

FIG. 4 is a detailed circuit diagram showing the first shifter 22A shown in FIG. 3. The other shifters in the rising output controller 21 and the falling output controller 25 have the same structure as that of the first shifter 22A. The first shifter 22A will be described as an exemplary structure.

As shown, the first shifter 22A includes first and second transfer gates TG1 and TG2, first and second inverters I1 and I2, and first and second latch units LAT1 and LAT2.

The first transfer gate TG1 transfers the data signal D when the clock signal CLK is inactivated with a logic level 'LOW'. The first latch unit LAT1 is initiated when the inverted reset signal RSTB is activated with a logic level 'LOW', and latches an output signal of the first transfer gate TG1 when the inverted reset signal RSTB is inactivated with a logic level 'HIGH'. The first inverter I1 inverts an output signal of the first latch unit LAT1 to output the second output signal Q05.

The second transfer gate TG2 transfers an output signal of the first inverter I1 when the clock signal CLK is activated with a logic level 'HIGH'. The second latch unit LAT2 is initiated when the inverted reset signal RSTB is activated with a logic level 'LOW', and latches an output signal of the second transfer gate TG2 when the inverted reset signal RSTB is inactivated with a logic level 'HIGH'. The second inverter I2 inverts an output signal of the second latch unit LAT2 to output the first output signal Q10.

As described above, the first shifter 22A delays the data signal D by a half clock to output the delayed signal as the second output signal Q05 and delays the second output signal Q05 by a half clock to output the delayed signal as the first output signal Q10. When the inverted reset signal RSTB is activated with the logic level 'LOW', the first and second latch units LAT1 and LAT2 output the data with a logic level 'HIGH'. As a result, the first and second output signals Q05 and Q10 are inactivated with a logic level 'LOW'.

Hereinafter, referring to FIGS. 3 and 4, operation of the rising output controller 21 will be described in detail.

First, if the initialization signal DOUT_RSTB is activated with a logic level 'LOW', the first and fourth shifters 22A to 22D are initiated so as to output the first and second output signal Q10 and Q05 with the logic level 'LOW' regardless of a logic level of the data signal D. In addition, the feedback shifter 24 outputs the first output signal Q10 with the logic level 'HIGH' regardless of a logic level of the data signal D.

Further, if the initialization signal DOUT_RSTB is inactivated with a logic level 'HIGH' and the rising driving signal ROUTEN is activated with a logic level 'HIGH', the first shifter 22A is synchronized with the falling DLL clock FCLKDLL, thereby outputting the second output signal Q05 a half clock later and the first output signal Q10 a half clock later therefrom.

The first rising output control signal driver 23A outputs a first upper rising output control signal RPOUTBU<0> and a first lower rising output control signal RPOUTBL<0> based on the second output signal Q05 output from the first shifter 22A. The first output signal Q10 of the first shifter 22A is input to the data signal D of the second shifter 22B having the same operation with that of the first shifter 22A.

After the rising driving signal ROUTEN is activated, the lower and upper rising output control signal groups RPOUTBU<0:3> and RPOUTBL<0:3> are activated in units of half clock.

The falling output controller 25 has the same structure and operation as that of the rising output controller 21 so as to output the lower and upper falling output control signal groups FPOUTBL<0:3> and FPOUTBU<0:3> in response to the falling driving signal FOUTEN and the rising DLL clock RCLKDLL. Herein, the lower and upper falling output control signal groups FPOUTBL<0:3> and FPOUTBU<0:3> have an opposite phase of the lower and upper rising output control signal groups RPOUTBU<0:3> and RPOUTBL<0:3>.

As described above, the output controller includes not only the rising output controller for generating the rising output control signal, but also the falling output controller for generating the falling output control signal having the opposite phase of the rising output control signal. Accordingly, the semiconductor memory device having the output controller consumes unnecessary current and a size thereof.

Figure 5:
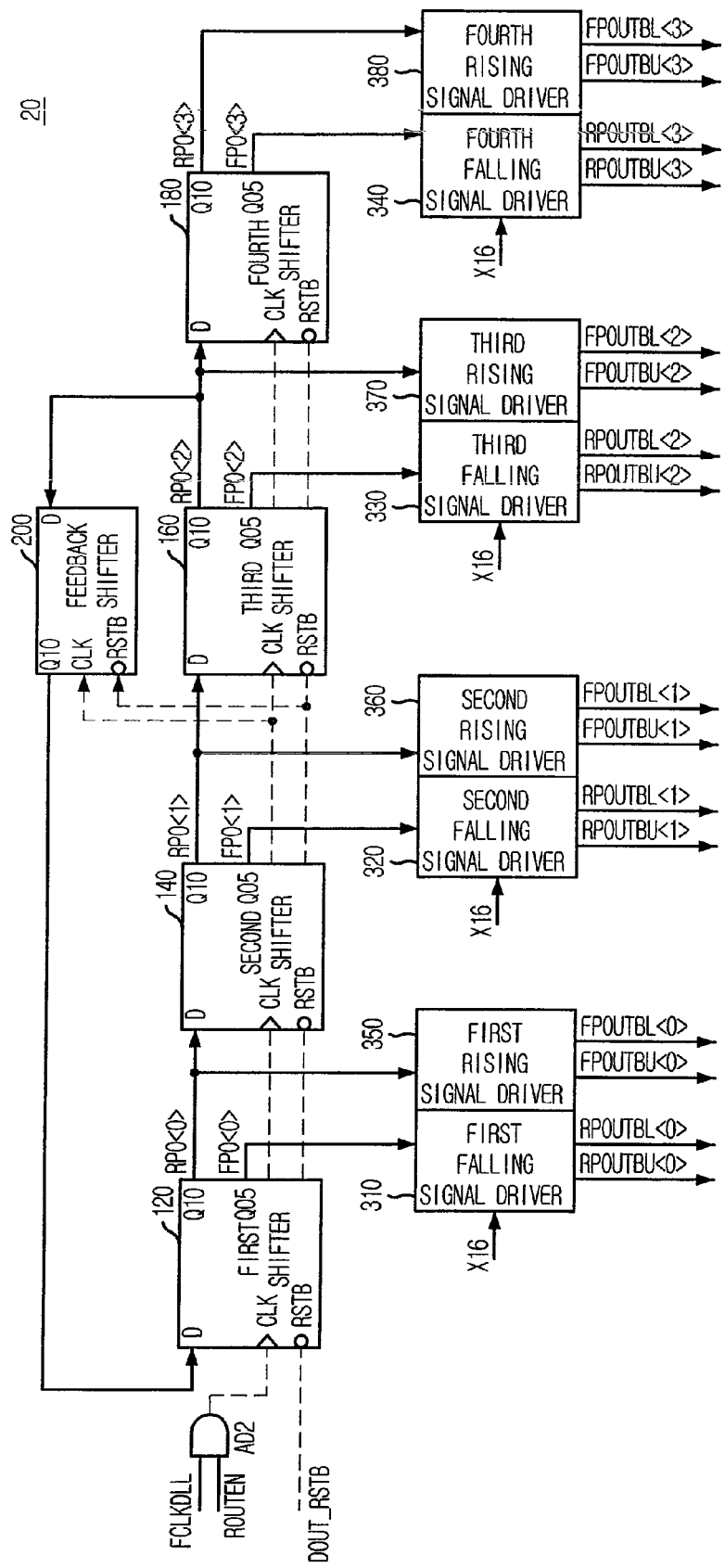
FIG. 5 is a block diagram describing an output controller in accordance with a second embodiment of the claimed invention.

FIG. 5 is a block diagram describing the output controller 20 in accordance with a second embodiment of the claimed invention.

As shown, the output controller 20 in accordance with the second embodiment of the claimed invention includes an AND gate AD2, first to fourth shifters 120, 140, 160 and 180, first to fourth rising output control signal drivers 310, 320, 330 and 340, first to fourth falling output control signal drivers 350, 360, 370 and 380, and a feedback unit 200.

The AND gate AD2 performs an AND operation of the falling DLL clock signal FCLKDLL and the rising driving signal ROUTEN. The first to fourth shifters 120 to 180 connected in series output first and second output signals Q10 and Q05 in units of half clock based on an output signal of the AND gate AD2. The feedback unit 200 receives the first output signal Q10 of the third shifter 160 and outputs the received signal to the data signal D of the first shifter 120. The first to fourth rising output control signal drivers 310 to 340 drive the second output signal Q05 of the first to fourth shifters 120 to 180 to output the lower and upper rising output control signal groups RPOUTBU<0:3> and RPOUTBL<0:

3>. The first to fourth falling output control signal drivers 350 to 380 drive the first output signal Q10 of the first to fourth shifters 120 to 180 to output the lower and upper falling output control signal groups FPOUTBU<0:3> and FPOUTBL<0:3>.

The feedback unit 200 may be implemented with a shifter which receives the output signal of the AND gate AD2 as a clock signal CLK, the initialization signal DOUT_RSTB as an inverted reset signal RSTB, and the first output signal Q10 of the third shifter 160 as a data signal D to thereby output a first output signal Q10 to the data signal D of the first shifter 120. Herein, the feedback unit 200 delays the data signal D inputted from the third shifter 160 by a clock and outputs the delayed signal as the first output signal Q10.

Further, the feedback unit 200 is initiated and applies initial data to the data signal D of the first shifter 120. Therefore, the first output signal Q10 of the feedback unit 200 may be output without delaying or be delayed by one clock or more according where the data output D is from.

The first to fourth shifters 120 to 180 receive the initialization signal DOUT_RSTB as an inverted reset signal RSTB, and a first output signal Q10 of a previous shifter as a data signal D to thereby output first and second output signals Q10 and Q05 in synchronization with the output signal of the AND gate AD2 as a clock signal CLK. Herein, the second output signal Q05 is generated by delaying the data signal D by a half clock and the first output signal Q10 is generated by delaying the second output signal Q05 by a half clock.

In FIG. 5, the first output signal Q10 of each shifter, represented as an intermediate rising output control signal group RPO<0:3>, is input to a corresponding one of the first to fourth falling output control signal drivers 350 to 380; and the second output signal Q05 of each shifter, represented as an intermediate falling output control signal FPO<0:3>, is input to a corresponding one of the first to fourth rising output control signal drivers 310 to 340. In particular, the first shifter 120 receives the first output signal Q10 of the feedback unit 200 as the data signal D.

As described above, the output controller in accordance with the second embodiment of the claimed invention includes the first to fourth shifters 120 to 180 for activating the first and second output signals Q05 and Q10 in units of half clock to thereby generate the lower and upper rising output control signal groups RPOUTBU<0:3> and RPOUTBL<0:3>, and the lower and upper falling output control signal groups FPOUTBL<0:3> and FPOUTBU<0:3> having an opposite phase of the lower and upper rising output control signal groups RPOUTBU<0:3> and RPOUTBL<0:3>.

Further, the output controller in accordance with the second embodiment generates the intermediate rising output control signal and the intermediate falling output control signal by a single shifter. For example, the first shifter 120 generates and outputs a first intermediate rising output control signal RPO<0> to the first falling output control signal drivers 350; and a first intermediate falling output control signal FPO<0> to the first rising output control signal drivers 310. As a result, it is possible to reduce unnecessary current consumption and a size thereof.

Figure 6:
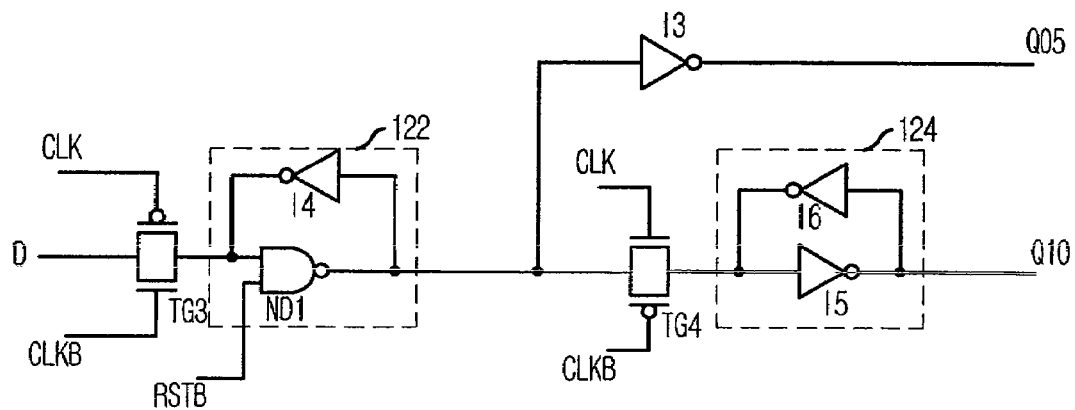
FIG. 6 is a detailed circuit diagram showing a first shifter shown in FIG. 5.

FIG. 6 is a detailed circuit diagram showing the first shifter 120 shown in FIG. 5. The second to fourth shifters 140 to 180 in the output controller have the same structure with that of the first shifter 120. The first shifter 120 will be described as an exemplary structure.

As shown, the first shifter 120 includes first and second transfer gates TG3 and TG4, a first inverter I3, and first and second latch units 122 and 124.

The first transfer gate TG3 transfers the data signal D when the clock signal CLK is inactivated with a logic level 'LOW'. The first latch unit 122 is initiated or latches an output signal of the first transfer gate TG3 based on the inverted reset signal RSTB. The first inverter I3 inverts an output signal of the first latch unit 122 and outputs the inverted signal as the second output signal Q05.

The second transfer gate TG4 transfers the output signal of the first latch unit 122 when the clock signal CLK is activated with a logic level 'HIGH'. The second latch unit 124 latches an output signal of the second transfer gate TG4 and outputs the latched signal as the first output signal Q10.

In detail, the first latch unit 122 includes a NAND gate ND1 and a second inverter I4 which is cross-coupled with the NAND gate ND1. The NAND gate ND1 performs a NAND operation of the inverted reset signal RSTB and the output signal of the first transfer gate TG3. The second inverter I4 inverts an output signal of the NAND gate ND1. The second latch unit 124 includes third and fourth inverters I5 and I6 cross-coupled with each other.

As described above, when the inverted reset signal RSTB is activated with the logic level 'LOW', the first latch unit 122 of the first shifter 120 outputs data with a logic level 'HIGH' regardless of a logic level of the data signal D. As a result, the second output signal Q05 is inactivated with a logic level 'LOW'. When the inverted reset signal RSTB is inactivated with the logic level 'HIGH', the first shifter 120 delays the data signal D by a half clock in synchronization with the clock signal CLK to output the second output signal QOS, and delays the data signal D by one clock in synchronization with the clock signal CLK to output the first output signal Q10.

Figure 7:
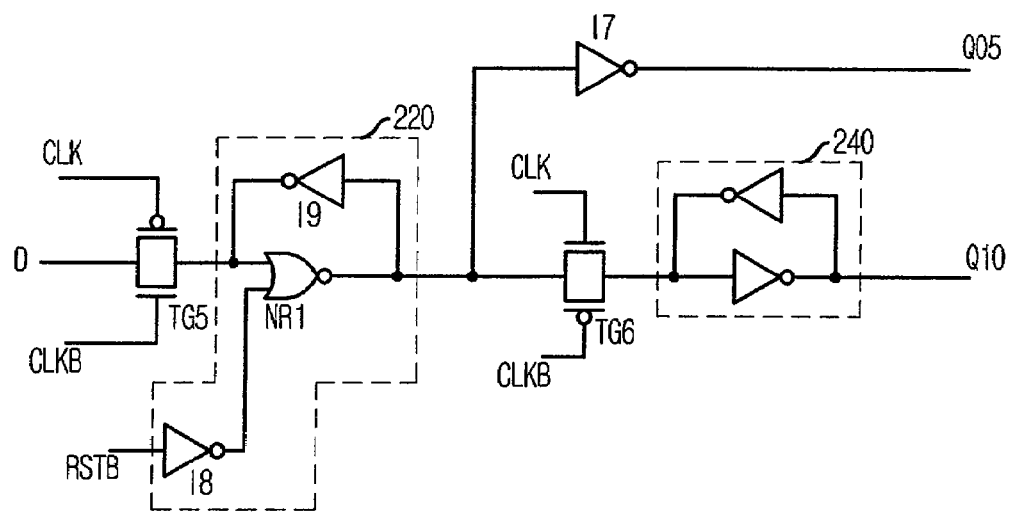
FIG. 7 is a detailed circuit diagram showing a feedback unit shown in FIG. 5.

FIG. 7 is a detailed circuit diagram showing the feedback unit 200 shown in FIG. 5.

As shown, the feedback unit 200 includes first and second transfer gates TG5 and TG6, a first inverter I7, and first and second latch units 220 and 240.

The first transfer gate TG5 transfers the data signal D when the clock signal CLK is inactivated with a logic level 'LOW'. The first latch unit 220 is initiated or latches an output signal of the first transfer gate TG5 based on the inverted reset signal RSTB. The first inverter I7 inverts an output signal of the first latch unit 220 and outputs the inverted signal as the second output signal Q05.

The second transfer gate TG6 transfers the output signal of the first latch unit 220 when the clock signal CLK is activated with a logic level 'HIGH'. The second latch unit 240 latches an output signal of the second transfer gate TG6 and outputs the latched signal as the first output signal Q10.

In detail, the first latch unit 220 includes a NOR gate NR1 and second and third inverters I8 and I9. The second inverter I8 inverts the inverted reset signal RSTB. The NOR gate NR1 performs a NOR operation of output signals of the second inverter I8 and the first transfer gate TG5. The third inverter I9 cross-coupled with the NOR gate NR1 inverts an output signal of the NOR gate NR1. The second latch unit 240 includes cross-coupled inverters.

As described above, when the inverted reset signal RSTB is activated with the logic level 'LOW', the first latch unit 220 of the feedback unit 200 outputs the data with a logic level 'LOW' regardless of a logic level of the data signal D. As a result, the second output signal Q05 is activated with a logic level 'HIGH'. When the inverted reset signal RSTB is inactivated with the logic level 'HIGH', the feedback unit 200 delays the data signal D by a half clock in synchronization with the clock signal CLK to output the second output signal Q05, and delays the data signal D by one clock in synchronization with the clock signal CLK to output the first output signal Q10.

Figure 8:
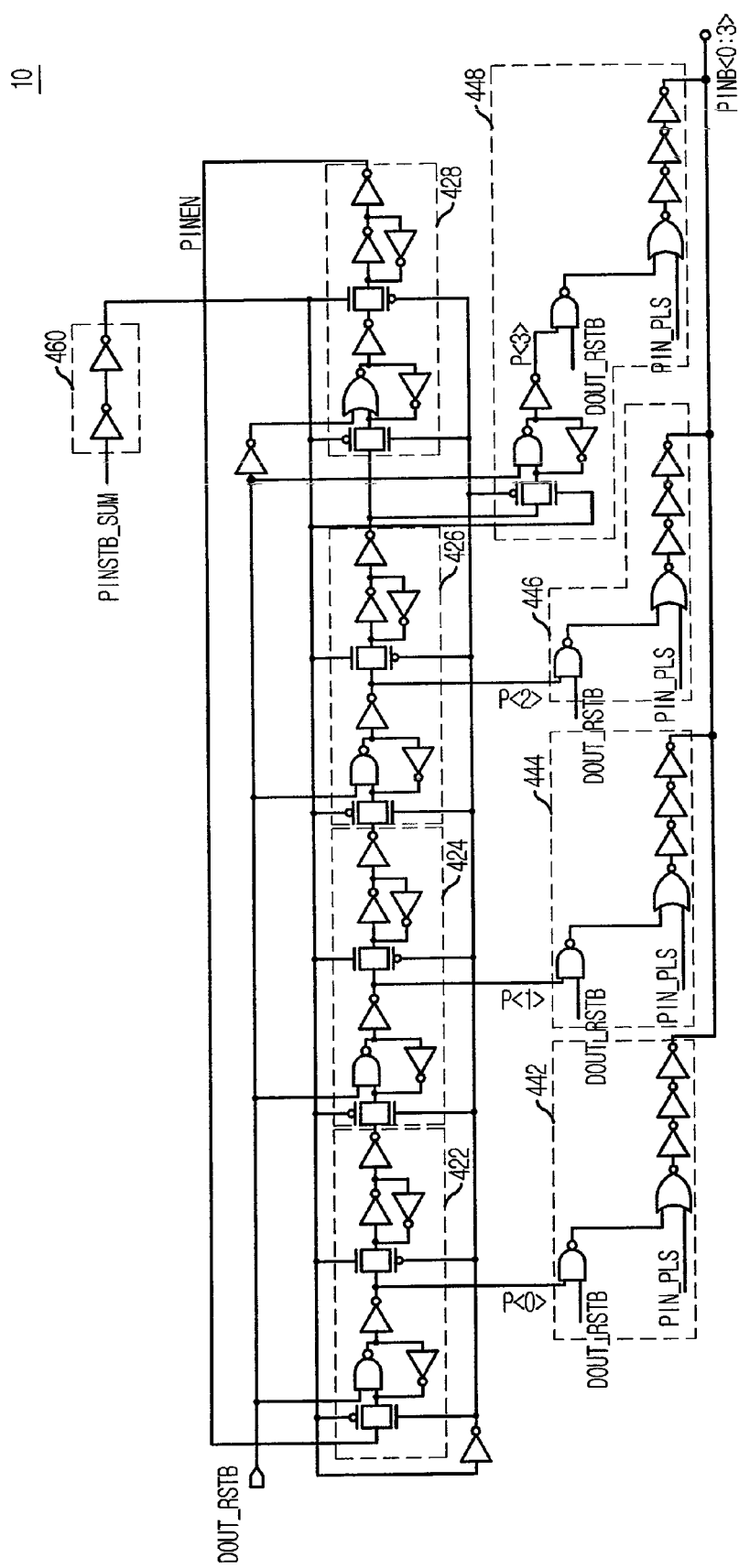
FIG. 8 is a detailed circuit diagram showing an input controller shown in FIG. 2.

FIG. 8 is a detailed circuit diagram showing the input controller 10 shown in FIG. 2.

As shown, the input controller 10 includes an inverter chain 460, first to fourth shifters 422, 424, 426 and 428, and first to fourth signal output units 442, 444, 446 and 448.

The inverter chain 460 includes an even number of inverters in order to delay and transfer the column-related clock signal PINSTB_SUM. The first to fourth shifters 422 to 428 are turned-off in response to the initialization signal DOUT_RSTB and transfer an intermediate signal group P<0:3> to the first to fourth signal output units 442 to 448 in response to an output signal of the inverter chain 460. The first to fourth signal output units 442 to 448 control the intermediate signal group P<0:3> based on the initialization signal DOUT_RSTB and a delayed column-related clock signal PIN_PLS, and output the input control signal group PINB<0:3>.

In an initial step, if the initialization signal DOUT_RSTB is activated with a logic level 'LOW', an output signal PINEN of the fourth signal output unit 428 has a logic level 'HIGH' so that the first to fourth shifters 422 to 428 are turned-off. The first to fourth signal output units 442 to 448 outputs the input control signal group PINB<0:3> which is inactivated with a logic level 'HIGH' in response to the initialization signal DOUT_RSTB.

Subsequently, the read command RD is input so that the column-related clock signal PINSTB_SUM is activated with a logic level 'LOW', the first to fourth signal output units 442 to 448 output the input control signal group PINB<0:3> which is sequentially activated with a logic level 'LOW'.

Figure 9:
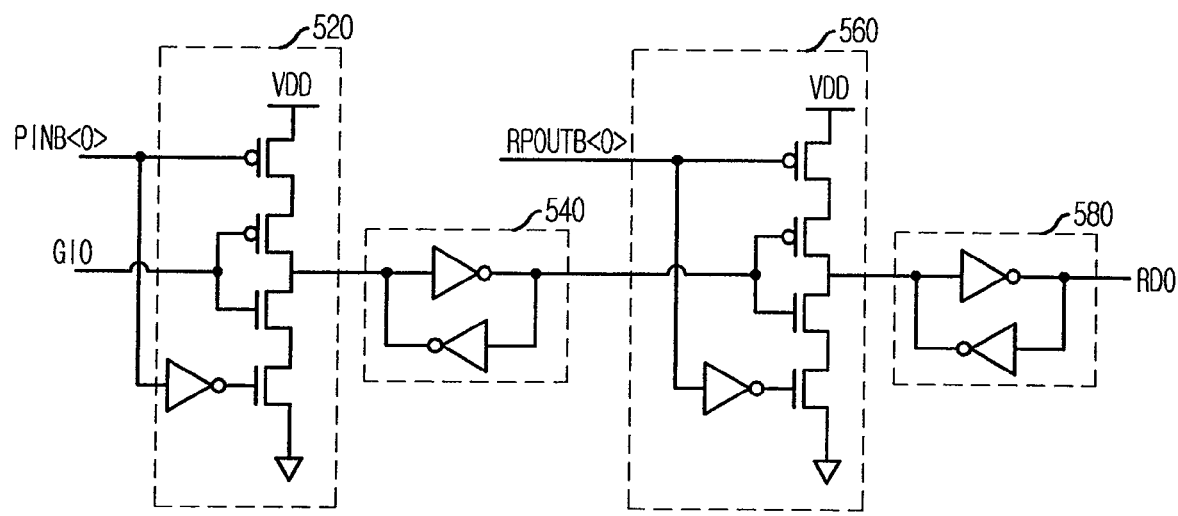
FIG. 9 is a detailed circuit diagram showing a first pipe latch unit shown in FIG. 2.

FIG. 9 is a detailed circuit diagram showing the first pipe latch unit 32 shown in FIG. 2. The second to fourth pipe latch units 34 to 38 have the same structure as that of the first pipe latch unit 32. The first pipe latch unit 32 will be described as an exemplary structure. A data path for outputting the rising output data RDO is described in detail.

As shown, the first pipe latch unit 32 includes an input unit 520, an output unit 560, and first and second latch units 540 and 580.

The input unit 520 receives and transfers data on the global data line GIO in response to a first input control signal PINB<0>. The first latch unit 540 latches an output signal of the input unit 520. The output unit 560 receives and transfers data stored in the first latch unit 540 in response to a first rising output control signal RPOUTB<0>. The second latch unit 580 latches an output signal of the output unit 560 and outputs the rising output data RDO.

A data path for outputting the falling output data FDO is the same structure and operation as that of the data path for outputting the rising output data RDO except for using a first falling output control signal FPOUTB<0> instead of the first rising output control signal RPOUTB<0>.

Further, in the aforementioned second embodiment of the claimed invention, the output controller 20 may be operated based on the falling driving signal FOUTEN and the rising DLL clock RCLKDLL instead of the rising driving signal ROUTEN and falling DLL clock FCLKDLL. In this time, each shifter also outputs the intermediate rising output control signal group RPO<0:3> as the first output signal Q10 and the intermediate falling output control signal FPO<0:3> as the second output signal Q05. Accordingly, the invention is not limited by the rising DLL clock, the falling DLL clock or other operating signals thereof.

Furthermore, the aforementioned second embodiment of the claimed invention discloses that the semiconductor memory device operates under an X16 output mode. The rising and falling output control signal drivers output the lower and upper rising output control signal groups RPOUTBL<0:3> and RPOUTBU<0:3>, and the lower and upper falling output control signal groups FPOUTBL<0:3> and FPOUTBU<0:3>. The invention is not limited by the number of the output control signals from the output control signal drivers.

In the first and second embodiments of the invention, the pipe latch block includes four shifters and four output control signal drivers because the DDR II SDRAM performs the 4-bit prefetch which transfers 4-bit memory cell data to the global data line GIO. The invention is not limited by the number of the shifters and the rising and falling output control signal drivers.

As described above, in the semiconductor memory device of the invention, the rising and falling output control signal drivers of the output controller receives the intermediate rising output control signal group and the falling output control signal group from the same shifter. As a result, the output controller may reduce the number of the shifters, thereby reducing unnecessary current consumption and a size thereof.

The present application contains subject matter related to the Korean patent application Nos. KR 2005-90922 & KR 2005-128589, filed in the Korean Patent Office on Sep. 29, 2005 & Dec. 23, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. An output controller, comprising:
   a plurality of shifters each configured to delay an input data signal by a half clock and one clock of a clock signal to output a first and a second output signal, respectively, in synchronization with a delay locked loop (DLL) clock signal and a driving signal; and
   a plurality of output control signal drivers for outputting a first and a second output control signal groups based on the first and the second output signals of the plurality of shifters.

2. The output controller as recited in claim 1, further comprising a first logic gate configured to generate the clock signal by performing an AND operation of the DLL clock signal and the driving signal.

3. The output controller as recited in claim 2, wherein the plurality of shifters are connected in series and each shifter receives an initialization signal as a reset signal, and a first output signal of its previous shifter as an input data signal, thereby outputting the second output signal by delaying the input data signal by the half clock and the first output signal by delaying the input data signal by one clock in synchronization with the clock signal.

4. The output controller as recited in claim 3, wherein each shifter includes:
   a first transfer gate configured to transfer the input data signal in response to a first logic level of the clock signal;
   a first latch unit configured to be initiated or latch an output signal of the first transfer gate based on the reset signal;
   a first inverter configured to invert an output signal of the first latch unit and output the second output signal;

a second transfer gate configured to transfer the output signal of the first latch unit in response to a second logic level of the clock signal; and a second latch unit configured to latch an output signal of the second transfer gate and output the latched signal as the first output signal.

5. The output controller as recited in claim 4, wherein the first latch unit includes:

a second logic gate configured to perform a NAND operation of the reset signal and the output signal of the first transfer gate; and a second inverter cross-coupled with the second logic gate, for inverting an output signal of the second logic gate.

6. The output controller as recited in claim 3, further including a feedback unit receiving a first output signal of one of the plurality of shifters and an output signal of the feedback unit is input to a first shifter among the plurality of shifters.

7. The output controller as recited in claim 6, wherein the feedback unit is reset when the initialization signal is activated; and delays the received first output signal to provide the delayed signal to the first shifter in synchronization with the clock signal when the initialization signal is inactivated.

8. The output controller as recited in claim 7, wherein the feedback unit includes a feedback shifter which receives the initialization signal as a reset signal, and the first output signal of a second to the last shifters among the plurality of shifters as an input data signal, thereby outputting the first output signal delayed by one clock of the clock signal.

9. The output controller as recited in claim 8, wherein the feedback shifter includes:

a first transfer gate configured to transfer the input data signal in response to a first logic level of the clock signal;

a first latch unit configured to be initiated or latch an output signal of the first transfer gate based on the reset signal;

a second transfer gate configured to transfer the output signal of the first latch unit in response to a second logic level of the clock signal; and a second latch unit configured to latch an output signal of the second transfer gate and output the latched signal.

10. The output controller as recited in claim 9, wherein the first latch unit of the feedback shifter includes:

a first inverter configured to invert the reset signal;

a second logic gate configured to perform a NOR operation of output signals of the first inverter and the first transfer gate; and a second inverter cross-coupled with the second logic gate, for inverting an output signal of the second logic gate.

11. An output controller, comprising:

a plurality of shifters each configured to delay an input data signal to output a first and a second output signals in synchronization with a falling delay locked loop (DLL) clock signal and a driving signal;

a feedback unit configured to receive the first output signal of one of the plurality of shifters and provide a feedback signal to a first shifter among the plurality of shifters;

a plurality of rising output control signal drivers configured to output a rising output control signal group based on the second output signals of the plurality of shifters; and a plurality of falling output control signal drivers configured to output a falling output control signal group based on the first output signals of the plurality of shifters.

12. The output controller as recited in claim 11, further comprising a first logic gate configured to perform an AND operation of the falling DLL clock signal and the driving signal and output a clock signal.

13. The output controller as recited in claim 12, wherein each shifter delays the input data signal by a half clock of the clock signal to output the second output signal and by one clock of the clock signal to output the first output signal in synchronization with the falling DLL clock signal when the driving signal is activated.

14. The output controller as recited in claim 13, wherein the plurality of shifters having N number of shifters are connected in series, N being a positive integer, and each shifter receives an initialization signal as a reset signal, and a first output signal of its previous shifter as the input data signal, thereby outputting the second output signal by delaying the input data signal by the half clock and the first output signal by delaying the input data signal by one clock.

15. The output controller as recited in claim 14, wherein the first shifter receives the feedback signal as the input data signal.

16. The output controller as recited in claim 15, wherein each shifter includes:

a first transfer gate configured to transfer the input data signal in response to a first logic level of the clock signal;

a first latch unit configured to be initiated or latch an output signal of the first transfer gate based on the reset signal;

a first inverter configured to invert an output signal of the first latch unit and output the second output signal;

a second transfer gate configured to transfer the output signal of the first latch unit in response to a second logic level of the clock signal; and a second latch unit configured to latch an output signal of the second transfer gate and output the latched signal as the first output signal.

17. The output controller as recited in claim 16, wherein the first latch unit includes:

a second logic gate configured to perform a NAND operation of the reset signal and the output signal of the first transfer gate; and a second inverter cross-coupled with the second logic gate, for inverting an output signal of the second logic gate.

18. The output controller as recited in claim 14, wherein the feedback unit is reset when the initialization signal is activated; and delays the received first output signal to provide the delayed data to the first shifter in synchronization with the clock signal when the initialization signal is inactivated.

19. The output controller as recited in claim 18, wherein the feedback unit includes a feedback shifter which receives the initialization signal as a reset signal, and the first output signal of an (N−1)th shifter among the N number of shifters as an input data signal, thereby outputting the first output signal delayed by one clock of the clock signal.

20. The output controller as recited in claim 19, wherein the feedback shifter includes:

a first transfer gate configured to transfer the input data signal in response to a first logic level of the clock signal;

a first latch unit configured to be initiated or latch an output signal of the first transfer gate based on the reset signal;

a second transfer gate configured to transfer an output signal of the first latch unit in response to a second logic level of the clock signal; and a second latch unit configured to latch an output signal of the second transfer gate and output the latched signal.

21. The output controller as recited in claim 20, wherein the first latch unit includes:

a first inverter configured to invert the reset signal;

a second logic gate configured to perform a NOR operation of output signals of the first inverter and the first transfer gate; and a second inverter cross-coupled with the second logic gate, for inverting an output signal of the second logic gate.

22. An output controller, comprising:

a first logic gate configured to perform an AND operation of a rising delay locked loop (DLL) clock signal and a driving signal and output a clock signal;

a plurality of shifters each configured to delay an input data signal by a half clock of the clock signal to output the second output signal and by one clock of the clock signal to output the first output signal in synchronization with the rising DLL clock signal when the driving signal is activated;

a feedback unit configured to receive the first output signal of one of the plurality of shifters and provide a feedback signal to a first shifter among the plurality of shifters;

a plurality of rising output control signal drivers configured to output a rising output control signal group based on the first output signals of the plurality of shifters; and a plurality of falling output control signal drivers configured to output a falling output control signal group based on the second output signals of the plurality of shifters.

* * * * *